(12) United States Patent
Feuerstack

(10) Patent No.: US 9,923,478 B2
(45) Date of Patent: Mar. 20, 2018

(54) CAPACITOR ARRANGEMENT AND METHOD FOR OPERATING A CAPACITOR ARRANGEMENT

(71) Applicant: Robert Bosch GmbH, Stuttgart (DE)

(72) Inventor: Peter Feuerstack, Ludwigsburg (DE)

(73) Assignee: Robert Bosch GmbH, Stuttgart (DE)

( * ) Notice: Subject to any disclaimer, the term of this patent is extended or adjusted under 35 U.S.C. 154(b) by 0 days.

(21) Appl. No.: 15/032,378

(22) PCT Filed: Oct. 21, 2014

(86) PCT No.: PCT/EP2014/072486
§ 371 (c)(1),
(2) Date: Apr. 27, 2016

(87) PCT Pub. No.: WO2015/062901
PCT Pub. Date: May 7, 2015

(65) Prior Publication Data
US 2016/0268921 A1    Sep. 15, 2016

(30) Foreign Application Priority Data
Oct. 28, 2013  (DE) .......................... 10 2013 221 834

(51) Int. Cl.
*H02M 7/00* (2006.01)
*H01G 9/008* (2006.01)
(Continued)

(52) U.S. Cl.
CPC ............ *H02M 7/003* (2013.01); *H01G 9/008* (2013.01); *H01G 9/14* (2013.01); *H01G 9/26* (2013.01);
(Continued)

(58) Field of Classification Search
CPC .......... H02M 7/12; H02M 7/003; H02M 5/44; H05K 7/209; H05K 7/1432; H05K 7/14;
(Continued)

(56) References Cited

U.S. PATENT DOCUMENTS

| 4,992,925 A |   | 2/1991 | Meyer |
|---|---|---|---|
| 5,184,280 A | * | 2/1993 | Fouad ................... H02G 5/005 174/72 B |

(Continued)

FOREIGN PATENT DOCUMENTS

| DE | 3802593 | 8/1989 |
|---|---|---|
| DE | 29805943 | 6/1998 |

(Continued)

OTHER PUBLICATIONS

International Search Report for Application No. PCT/EP2014/072486 dated Feb. 20, 2015 (English Translation, 3 pages).

*Primary Examiner* — Kyle J Moody
(74) *Attorney, Agent, or Firm* — Michael Best & Friedrich LLP

(57) ABSTRACT

The present invention provides a low-inductivity and mechanically stable connection between a DC link capacitor and a switching module for a power electronic system. To this end, the DC link capacitor and the switching module are connected to each other via an electrically conductive, flexible connection arrangement of electrically conductive strips or films. The individual strips or films are spaced from each other via suitable isolation media.

8 Claims, 3 Drawing Sheets

(51) Int. Cl.
*H01G 9/14* (2006.01)
*H05K 7/14* (2006.01)
*H01G 9/26* (2006.01)
*H02M 7/12* (2006.01)
*H05K 7/20* (2006.01)

(52) U.S. Cl.
CPC ............ *H02M 7/12* (2013.01); *H05K 7/1432* (2013.01); *H05K 7/209* (2013.01); *Y02T 10/7022* (2013.01)

(58) Field of Classification Search
CPC . H01G 9/26; H01G 9/008; H01G 9/14; Y02T 10/7022; H01R 25/161; H01R 35/02; H01R 25/16; H02B 1/20
See application file for complete search history.

(56) References Cited

U.S. PATENT DOCUMENTS

| | | | |
|---|---|---|---|
| 8,787,003 B2 * | 7/2014 | Domes | H05K 7/1432 174/529 |
| 2004/0062006 A1 | 4/2004 | Pfeifer et al. | |
| 2004/0069527 A1 | 4/2004 | Vanhoutte et al. | |
| 2013/0094122 A1 | 4/2013 | Domes et al. | |

FOREIGN PATENT DOCUMENTS

| | | | |
|---|---|---|---|
| DE | 19845821 | | 4/2000 |
| DE | 10057140 MT | * | 11/2000 |
| DE | 10057140 | | 6/2002 |
| DE | 102005053397 | | 5/2007 |
| DE | 102012218579 | | 4/2013 |
| DE | 102012219791 | | 5/2013 |

* cited by examiner

CAPACITOR ARRANGEMENT AND METHOD FOR OPERATING A CAPACITOR ARRANGEMENT

BACKGROUND OF THE INVENTION

The present invention relates to a capacitor arrangement and a method for operating a capacitor arrangement.

Power electronic systems are increasingly being used in stationary applications, such as, for example, in wind turbines, as well as in mobile applications, such as, for example, in electric and hybrid vehicles. These power electronic systems, for example, enable a connected electrical machine to be operated at a variable rotational speed or to generate an output voltage which deviates from an input voltage. As a rule, said power electronic systems are supplied with a DC voltage which is supplied via a pulse width modulated inverter, also referred to as inverter. A so-called DC link, via which the power electronic system is connected to the DC voltage source, is characteristic for such systems. In order for the DC link to also be able to dynamically provide the currently required power, the DC link is buffered with a DC link capacitor. Said DC link of the power electronic system is furthermore electrically connected to power semiconductors, for example IGBTs or MOSFETs. The connection should preferably be implemented in a low-resistance and low-inductive manner and as short as possible, so that an overvoltage resulting at the power semiconductors during a switching operation remains small.

The German patent application DE 10 2012 218 579 A1 discloses, for example, a low-inductivity capacitor module and a power system comprising such a low-inductivity capacitor module. In this case, a multiplicity of capacitors is disposed on a metalized substrate. A set of capacitors from this multiplicity of capacitors is each connected in parallel.

When operating such a power electronic system, a power loss occurs particularly in the power semiconductors. As a result, the power electronic system warms up. Not all of the components, however, warm up to the same extent. In addition, the different materials used expand to a varying degree. It is thus possible for mechanical stresses to result in the power electronic system, in particular between the power modules and the DC link.

There is therefore the need for a capacitor arrangement which allows for a connection between DC link capacitor and switching modules which has inductance values that are as low as possible. There is further the need for a capacitor arrangement which enables mechanical stresses between the DC link and switching modules to be prevented or at least minimized.

SUMMARY OF THE INVENTION

According to a first aspect, the present invention provides a capacitor arrangement comprising a DC link capacitor with a first capacitor connection and a second capacitor connection, a switching module with a first module connection and a second module connection, and a connection arrangement comprising a first connection element which is designed to electrically connect the first capacitor connection to the first module connection and comprising a second connection element which is designed to electrically connect the second capacitor connection to the second module connection, wherein the first connection element and the second connection element comprise a flexible, electrically conductive material.

According to a further aspect, the present invention provides a method for operating a capacitor arrangement, comprising the following steps: providing a DC link capacitor comprising a first capacitor connection and a second capacitor connection; providing a switching module comprising a first module connection and a second module connection; connecting the first capacitor connection and the first module connection to a first electrically conductive, flexible connection element; and connecting the second capacitor connection and the second module connection to a second electrically conductive, flexible connection element.

According to a concept underlying the present invention, the DC link capacitor of a power electronic system is connected to a switching module of the power electronic system via a flexible, electrically conductive connection. By means of said flexible connection between DC link capacitor and power modules, an expansion of the connection between DC link capacitor and switching module due to heating can be particularly well compensated. Stresses, as they can occur due to thermal expansion at rigid connections, are therefore prevented. Such a flexible connection between DC link capacitor and power module is furthermore less susceptible to shocks, vibrations or similar mechanical stresses.

By using flexible connections between DC link capacitor and power module, it is furthermore possible to establish a connection between the components which has a particularly low inductivity. The shape as well as the course of the conducting path for the connection between DC link capacitor and power module can thereby be easily adapted to a particularly low-inductivity connection of the components.

The flexible connection between DC link capacitor and power module can, for example, be provided by means of a flexible metal strip. A flexible copper strip or something similar is particularly well suited to meeting this end. Other materials, in particular metals, from which flexible conductive strips can be produced, are also suitable for this purpose. Such flexible connections between DC link capacitor and power module furthermore simplify the installation of the power electronic system in comparison to systems which have to exclusively be constructed from rigid components and thus allow only very slight tolerances during manufacture.

According to one embodiment, the first connection element and the second connection element each comprise at least one electrically conductive film. Such electrically conductive films can, for example, be thin metallic films of copper or another metal that is suitable for the manufacture of flexible, electrically conductive metallic films. A particularly good low-inductivity, flexible connection between DC link capacitor and switching modules can be provided by such electrically conductive films.

According to one embodiment, the connection arrangement further comprises an isolation medium which is disposed between the first connection element and the second connection element. This isolation medium preferably relates to an electrically insulating film. This can, for example, relate to a plastic film consisting of a flexible plastic material. By means of such an isolation medium between the individual connection elements, said individual connection elements can be disposed at a small spatial distance from one another without a short circuit occurring between said individual connection elements. As a result, a particularly efficient, low-inductivity connection between DC link capacitor and switching module is made possible. In so doing, the electrically conductive films and the isolation medium are connected to one another, for example adhesively bonded to one another.

In one embodiment, the first connection element comprises a multiplicity of electrically conductive films, and the second connection element comprises a multiplicity of electrically conductive films. By using a multiplicity of electrically conductive films for each of the connection elements, a particularly good conductive and hence low-resistance and low-inductivity connection between DC link capacitor and switching module is made possible.

In one embodiment, the connection arrangement comprises a film stack, wherein the films of the first connection element and the films of the second connection element are in each case alternately stacked on top of each other, and wherein an electrically insulating isolation medium is disposed in each case between two adjacent films. Such a connection arrangement comprising a plurality of film layers for each connection element, in which films from different connection elements are alternately arranged, provides a particularly low-inductivity connection. The isolation media between the individual electrically conductive films are preferably made from electrically isolating films, for example from a flexible plastic.

In one exemplary embodiment, the capacitor arrangement further comprises a heat sink, the DC link capacitor and the switching module being thermally coupled to the heat sink. In this way, a particularly efficient cooling of all of the components used can be made possible by means of a single heat sink.

In one embodiment, the first connection element comprises a first connection which is designed to electrically connect the first connection element to the first capacitor connection; and the second connection element comprises a second connection which is designed to electrically connect the second connection element to the second capacitor connection. A particularly efficient as well as reliable electrical contacting of the connection element to the capacitor is made possible by such connections at the connection elements.

In one embodiment, the first connection element comprises a third connection which is designed to electrically connect the first connection element to the first module connection; and the second connection element comprises a fourth connection which is designed to electrically connect the second connection element to the second module connection. In this way, a reliable electrical contacting can also easily be achieved between connection element and switching module.

A further aspect of the present invention relates to a rectifier arrangement comprising an inventive capacitor arrangement which was previously described.

BRIEF DESCRIPTION OF THE DRAWINGS

Further embodiments and advantages of the present invention ensue from the following description with reference to the attached drawings. In the drawings.

DETAILED DESCRIPTION

Figure 1:
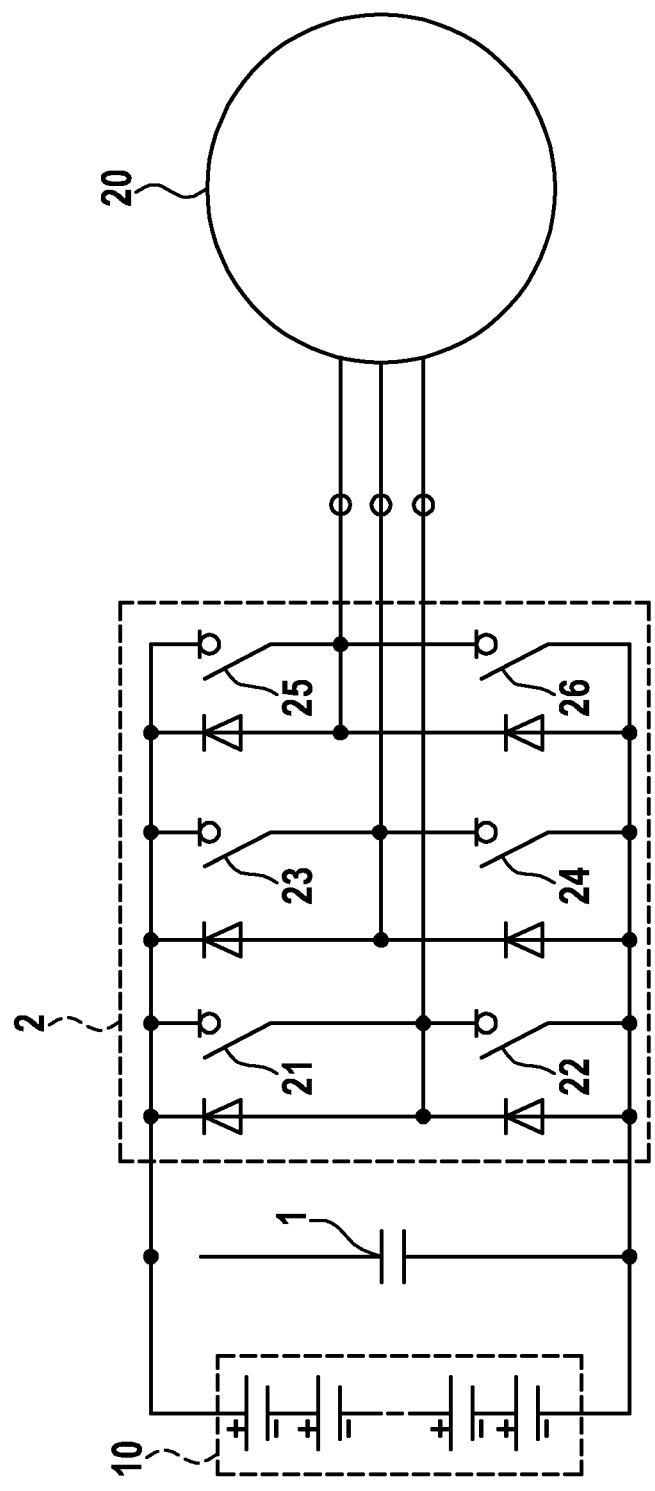
FIG. 1 shows a schematic depiction of a basic circuit diagram of a rectifier circuit comprising a capacitor arrangement according to one exemplary embodiment.

FIG. 1 shows a schematic depiction of a basic circuit diagram of a three-phase inverter circuit. The power electronic system is supplied by a storage battery 10. The DC voltage provided by this storage battery 10 is buffered by a DC link capacitor 1 and is subsequently supplied to a switching module 2 comprising a plurality of power semiconductors 21 to 26. By means of a corresponding control of the power semiconductors 21 to 26, the DC voltage is thereby converted into an AC voltage and is supplied to an electrical machine 20.

Although the capacitor arrangement is described below with reference to the previously described circuit arrangement of a drive system, the capacitor arrangement according to the invention is not limited to this application. The inventive capacitor arrangement can in fact be used for all applications, in which a DC link capacitor is to be electrically coupled to a switching module. Such applications can, for example, be stationary applications, such as inverters of wind turbines or photovoltaic systems. In addition, mobile applications in vehicles or the like are also possible. The capacitor arrangement can also be used for applications for converting DC voltage as well as for applications which convert a DC voltage into a DC voltage of another voltage level.

Figure 2:
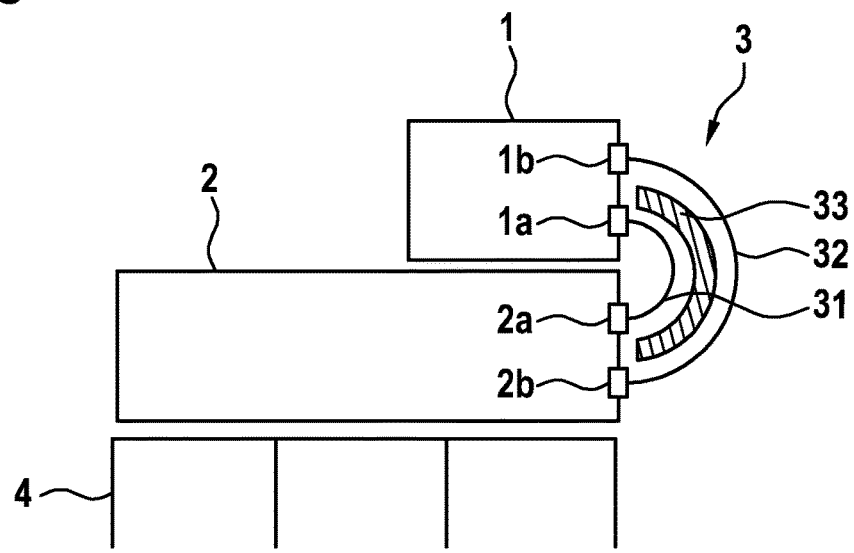
FIG. 2 shows a schematic depiction of a cross section through a capacitor arrangement according to a further exemplary embodiment'

FIG. 2 shows a schematic depiction of a cross section through a capacitor arrangement according to one embodiment. The DC link capacitor 1 comprises a first capacitor connection 1a and second capacitor connection 1b. These two capacitor connections 1a and 1b can, for example, be connected to a storage battery 10 from FIG. 1 (not depicted here). Alternatively, a connection to any other DC voltage source is also possible.

The capacitor arrangement further comprises a switching module 2 having at least two module connections 2a and 2b. The switching module 2 is supplied with a DC voltage via said two module connections 2a and 2b. The switching module 2 can relate, for example, to an inverter circuit comprising a plurality of power semiconductor switches according to FIG. 1. In addition, alternative switching modules, preferably switching modules on the basis of semiconductor switches, are however also possible. The switching modules 2 can, for example, contain one or a plurality of IGBT(s) or MOSFET(s). In this case, the one or plurality of switching elements in the switching module 2 is individually actuated by means of a control circuit that is not depicted.

The DC link capacitor 1 is connected to the switching module 2 by means a connection arrangement 3. In so doing, the first capacitor connection 1a of the DC link capacitor 1 is connected to the first module connection 2a of the switching module 2 via a first electrically conductive, flexible connection element 31. This first flexible connection element 31 can, for example, relate to a metal strip or a metallic film, for example consisting of copper or a similar highly conductive, flexible metal. In the same way, the second capacitor connection 1b of the DC link capacitor 1 is likewise connected to the second module connection 2b of the switching module 2 via a flexible, electrically conductive connection element 32. This too preferably relates to an electrically conductive metal strip or a flexible metallic film, which is constructed analogously to the first connection element 31.

In order to ensure isolation between the first connection element 31 and the second connection element 32, an isolation medium 33 is disposed between the two connection elements 31 and 32. Said isolation medium 33 relates, for example, to an electrically isolating, flexible plastic film. In this case, any material is possible which on the one hand has a sufficient isolating strength and is moreover sufficiently flexible. The isolation medium 33 furthermore has to have a sufficient thermal stability in order to take into account a heating, for example, on account of a power dissipation in the switching module 2.

A connection arrangement which has at least three flexible layers thus ensues from the exemplary embodiment depicted here for the connection arrangement 3 between the DC link capacitor 1 and the switching module 2: the first electrically conductive, flexible connection element 31 and the second electrically conductive, flexible connection element 32, and the likewise flexible, electrically non-conductive, insulating isolation medium 33 therebetween. Due to the flexibility of this connection arrangement, no stresses occur even when expansions due to heating result between the DC link capacitor 1 and the switching module 2. In addition, the design of the first connection element 31 and of the second connection element 32 as electrically conductive films or strips extending parallel to one another ensures a particularly low-inductivity electrical coupling of DC link capacitor 1 to switching module 2.

A heat sink 4 is disposed on the switching module 2 in order to cool the capacitor arrangement and to particularly to remove the dissipation loss occurring in the switching module. This heat sink 4 is thermally connected to the switching module; thus enabling said heat sink to effectively discharge the heat arising in the switching module 2 into the surrounding environment. In addition, the capacitor arrangement 1 can also likewise be thermally coupled to the heat sink 4. In this way, a particularly efficient cooling of all of the components of the capacitor arrangement is possible.

Figure 3:
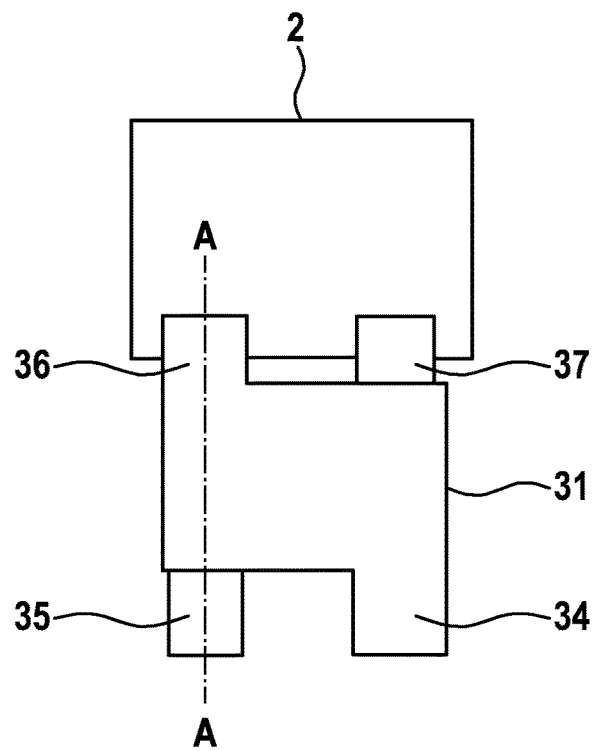
FIG. 3 shows a schematic depiction of a top view of a connection element for a capacitor arrangement according to a further exemplary embodiment.

FIG. 3 shows a schematic depiction of a top view of a connection arrangement for a capacitor arrangement. In the example depicted here, the connection arrangement 3 is only connected to the switching module 2. In order to provide a better depiction, the DC link capacitor 1 has been removed. The connection arrangement 3 is furthermore depicted in a planar manner in this example and not curved as in FIG. 2.

As can be seen in FIG. 3, the connection arrangement 3 has a plurality of connections for connecting the connection arrangement 3 to the DC link capacitor 1 and to the switching module 2. The first connection element, depicted here on top, has a first connection 34, with which the first connection element 31 can be electrically connected to the capacitor connection 1a. This first connection element 31 has a further connection 36 on the opposite side, with which the first connection element can be electrically coupled to the first module connection 1a of the switching module 1. These connections 34, 36 can, for example, be designed as screw connections, clamping connections, soldered connections or welded connections. In particular, neither an isolation medium nor a part of the second connection element 32 is present in the region of these connections 34, 36.

In an analogous form, the second connection element 32 has a connection 35, at which the second connection element 32 can be connected to the second capacitor connection 2b. On the opposite side, said second connection element 32 has a further connection 37 at which the second connection element 32 can be electrically connected to the second module connection 2b of the switching module 2. The second connection element 32 can thereby be connected at the connections 35, 37 in the same way to the DC link capacitor 1 or, respectively, to the switching module as was the case for the first connection element 31.

Figure 4:
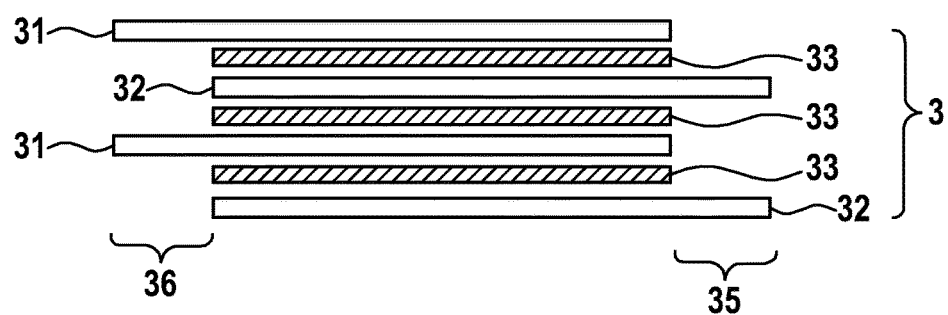
FIG. 4 shows a schematic depiction of a cross-section through a connection element for a capacitor arrangement according to a further exemplary embodiment.

FIG. 4 shows a schematic depiction of a cross section through a connection arrangement along the axis A-A from FIG. 3. As can be seen in FIG. 4, the connection arrangement 3 can also have more than one electrically conductive, flexible web of material. For example, an electrically conductive, flexible material web of the first connection element 31 and an electrically conductive, flexible material web of the second connection element 32 can in each case alternately be disposed on top of each other. In so doing, the individual electrically conductive, flexible material webs are each spaced apart from one another and electrically insulated by means of a suitable isolation medium 33. As was previously mentioned, the isolation medium 33 can, for example, relate to a flexible, electrically insulating film or something similar. In order to improve stability, the individual electrically conductive webs of the connection elements 31, 32 and the isolation media 33 disposed between said webs can each be connected to one another, for example adhesively bonded to one another.

It can thereby be seen, that the design in the regions in which the connections 34 to 37 are used for contacting to the capacitor connection 1a, 1b or to the module connection 2a, 2b is configured such that only electrically conductive material webs of one connection element 31, 32 are present. The electrically conductive material webs of the respectively other connection element 31, 32, just as the isolation medium 33, are not present in the region of these connections 34 to 37. In this way, a simple but nevertheless reliable contacting of the connection element 31, 32 to the capacitor connections 1a, 1b or, respectively, the module connections 2a, 2b can take place.

Figure 5:
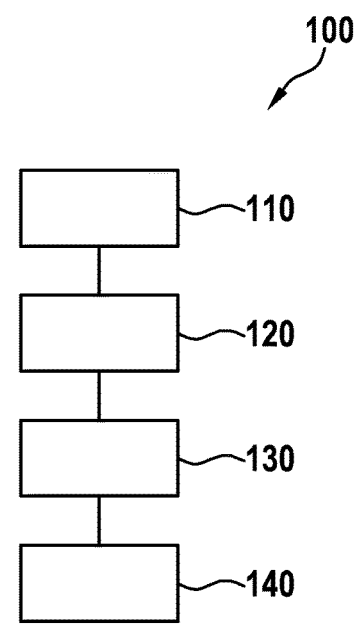
FIG. 5 shows a schematic depiction of a flow diagram for a method as said method underlies a further exemplary embodiment.

FIG. 5 shows a schematic depiction for a method 100 for operating a capacitor arrangement upon which method an exemplary embodiment of the present invention is based. A DC link capacitor 1 comprising a first capacitor connection 1a and a second capacitor connection 1b is provided in step 110. A switching module 2 comprising a first module connection 2a and a second module connection 2b is provided in step 120. In step 130, the first capacitor connection 1a and the first module connection 2a are subsequently connected to an electrically conductive, flexible first connection element 31; and in step 140, the second capacitor connection 1b and the second module connection 2b are connected to an electrically conductive, flexible second connection element 32.

In summary, the present invention relates to a low-inductivity and mechanically stable connection between a DC link capacitor and a switching module for a power electronic system. To this end, the DC link capacitor and the switching module are connected to each other via an electrically conductive, flexible connection arrangement of electrically conductive strips or films. The individual strips or films are spaced from each other via suitable isolation media.

The invention claimed is:

1. A capacitor arrangement, comprising:
   a DC link capacitor including a first capacitor connection and a second capacitor connection;
   a switching module including a first module connection and a second module connection;
   a connection arrangement including a first connection element designed to electrically connect the first capacitor connection directly to the first module connection and a second connection element designed to electrically connect the second capacitor connection directly to the second module connection, wherein the first connection element and the second connection element are formed from a flexible, electrically conductive material, wherein the first connection element includes a multiplicity of electrically conductive films and the second connection element includes a multiplicity of electrically conductive films, and wherein the connection arrangement includes a film stack, and the films of the first connection element and the films of the second connection element are in each case alternately stacked on top of one another, and wherein an electrically insulating isolation medium is respectively disposed between two adjacent films.

2. The capacitor arrangement according to claim 1, wherein the first connection element and the second connection element comprise electrically conductive films.

3. The capacitor arrangement according to claim 1, wherein the connection arrangement comprises an isolation medium which is disposed between the first connection element and the second connection element.

4. The capacitor arrangement according to claim 1, comprising a heat sink, wherein the DC link capacitor and the switching module are thermally coupled to the heat sink.

5. The capacitor arrangement according to claim 1, wherein the first connection element comprises a first connection, which is designed to electrically connect the first connection element to the first capacitor connection, and the second connection element comprises a second connection, which is designed to electrically connect the second connection element to the second capacitor connection.

6. The capacitor arrangement according to claim 5, wherein the first connection element has a third connection which is designed to electrically connect the first connection element to the first module connection, and the second connection element has a fourth connection which is designed to electrically connect the second connection element to the second module connection.

7. A rectifier arrangement, comprising a capacitor arrangement according to claim 1.

8. A method for operating a capacitor arrangement, comprising the steps:

providing a DC link capacitor including a first capacitor connection and a second capacitor connection;

providing a switching module including a first module connection and a second module connection;

connecting the first capacitor connection and the first module connection directly to a first electrically conductive, flexible connection element, wherein the first electrically conductive, flexible connection element includes a multiplicity of electrically conductive films; and connecting the second capacitor connection and the second module connection directly to a second electrically conductive, flexible connection element, wherein the second electrically conductive, flexible connection element includes a multiplicity of electrically conductive films, wherein the films of the first electrically conductive, flexible connection element and the films of the second electrically conductive, flexible connection element are in each case alternately stacked on top of one another, and wherein an electrically insulating isolation medium is respectively disposed between two adjacent films.

* * * * *